United States Patent [19]
Ali et al.

[11] Patent Number: 5,356,947
[45] Date of Patent: Oct. 18, 1994

[54] CONTROLLABLE RADIATION CURABLE PHOTOINIFERTER PREPARED ADHESIVES FOR ATTACHMENT OF MICROELECTRONIC DEVICES AND A METHOD OF ATTACHING MICROELECTRONIC DEVICES THEREWITH

[75] Inventors: Mahfuza B. Ali; Jean M. Pujol, both of St. Paul, Minn.

[73] Assignee: Minnesota Mining and Manufacturing Company, St. Paul, Minn.

[21] Appl. No.: 968,251

[22] Filed: Oct. 29, 1992

Related U.S. Application Data

[63] Continuation of Ser. No. 501,273, Mar. 29, 1990, abandoned.

[51] Int. Cl.$^5$ .................. C08F 2/50; C08F 265/06; C08F 285/00
[52] U.S. Cl. ........................... 522/57; 522/81; 522/83; 522/90; 522/96; 522/100; 522/103; 522/149; 522/166; 522/173; 522/174; 522/904
[58] Field of Search ............ 522/57, 149, 173, 174, 522/904, 182, 18, 90, 96, 100, 103, 166, 81, 83; 528/69, 356, 363, 364, 366, 390; 526/258, 260; 525/260; 428/40, 355

[56] References Cited

U.S. PATENT DOCUMENTS

| | | | |
|---|---|---|---|
| 3,488,327 | 1/1970 | Kollinsky et al. | 526/260 |
| 3,511,894 | 5/1970 | Markert | 525/260 |
| 3,928,499 | 12/1975 | Tomalia et al. | 522/149 |
| 4,304,705 | 12/1981 | Heilmann et al. | 522/149 |
| 4,518,794 | 5/1985 | Boutevin et al. | 522/149 |
| 4,587,313 | 5/1986 | Ohta et al. | 522/149 |

FOREIGN PATENT DOCUMENTS

| | | | |
|---|---|---|---|
| 0128731 | 12/1984 | European Pat. Off. | 526/260 |
| 0241132 | 10/1987 | European Pat. Off. | C09D 3/80 |
| 0286376 | 6/1988 | European Pat. Off. | |
| o273795 | 7/1988 | European Pat. Off. | C08F 8/00 |
| 0349232 | 1/1990 | European Pat. Off. | C08F 293/00 |
| 0349270 | 1/1990 | European Pat. Off. | C09J 153/00 |
| 24879 | 1/1989 | Japan | 522/57 |
| 29410 | 1/1989 | Japan | 522/57 |
| 3-9914 | 1/1991 | Japan | C08F 293/00 |

OTHER PUBLICATIONS

"Organofunctional Silanes", *Union Carbide Brochure*, pp. 5–10, 1983.

"Photoinitiators, Types and Properties" by Peter Nicholl Green, *Polymers Paint Colour Journal*, vol. 175, No. 4141, pp. 246–252; 1985.

Hatada et al., *A New LSI Bonding Technology "Micron Bump Bonding Assembly Technology"*, presented at the 39th Electronic Components Conference, 1989, CH25484/88/0000-0023, pp. 23–27.

Hatada et al., *A New LSI Bonding Technology "Micron Bump Bonding Technology"*, presented at the 39th Electronic Components Conference, 1989, 0569-5503/89/0045, pp. 45–49.

Hatada et al., *Special Issue/Assembling Mounting Technology: Recent Trends in Wireless Bonding Technology*, Semiconductor World, Sep. 1987.

Otsu et al., "*Living Radical Polymerizations in Homogeneous Solution by Using Organic Sulfides as Photoiniferters*", Polymer Bulletin, 7, 1982, pp. 45–50.

Otsu et al., "*Living Mono- and Biradical Polymerizations in Homogenous System Synthesis of AB and ABA Type Block Copolymers*", Polymer Bulletin, 11, 1984, pp. 135–142.

Hatada et al., *Special Issue/Hybrid Microelectronics Microbump Bonding Technology*.

*Primary Examiner*—Susan W. Berman
*Attorney, Agent, or Firm*—Gary L. Griswold; Walter N. Kirn; Janice L. Dowdall

[57] ABSTRACT

The present invention provides controllably curable photoiniferter containing adhesive compositions which are suitable for the mounting of microelectronic devices such as flip chips onto transparent wiring boards, a method of making the adhesive compositions, and a method of using the adhesive compositions in order to bond microelectronic devices to transparent wiring boards by intermittent exposure of the adhesive composition to a radiant energy source. The adhesive compositions can be cured in a stepwise fashion by intermittent controlled exposure to a source of radiation thus providing exactly the amount of cure and hardening desired.

11 Claims, No Drawings

CONTROLLABLE RADIATION CURABLE PHOTOINIFERTER PREPARED ADHESIVES FOR ATTACHMENT OF MICROELECTRONIC DEVICES AND A METHOD OF ATTACHING MICROELECTRONIC DEVICES THEREWITH

This is a continuation of application Ser. No. 07/501,273 filed Mar. 29, 1990, now abandoned.

FIELD OF INVENTION

The present invention relates to ultraviolet and visible light curable adhesive compositions useful for bonding microelectronic devices. More specifically, the invention relates to ultraviolet and visible light curable adhesive compositions suitable for preparing flip chip direct attachment adhesive films. These adhesive films are useful for mounting flip chip semiconductor devices onto transparent wiring boards.

BACKGROUND OF INVENTION

In recent years surface mounting technology has been introduced for electrically interconnecting microelectronic devices such as flip chip semiconductor devices to wiring boards. This technology permits the attainment of a higher density of interconnection as compared to conventional methods of interconnection. Conventional methods of interconnection include wire bonding and solder reflow. High density application using flip chip surface mounting attachment technology offers the advantage of miniaturization. Methods of flip chip interconnection include solder bump interconnection, conductive adhesive bonding, gang bonding for polyimide tape carrier system, and pressure engaged adhesive interconnection. The solder fellow and tape interconnection methods both possess pitch limitations. Adhesives, on the other hand, permit the attainment of fine pitch connections.

Hatada U.S. Pat. No. 4,749,120 discloses a method of connecting flip chips to a wiring board by means of a resin of a modified acrylate group in which light and heat are used in addition to pressure in order to stiffen the resin. A New LSI Bonding Technology Micron Bump Bonding Assembly Technology, presented at the 39th Electronic Components Conference, May 22, 24, 1989, Houston, 0569-5503/89/0045 IEEE and CH 25484/88/0000-0023 IEEE discloses the use of a light setting insulating resin to bond a large scale integration (LSI) chip to the electrodes on a substrate. *Special Issue/Assembling Mounting Technology: Recent Trends in Wireless Bonding Technolgy* by Hatada et al., Semiconductor World, September, 1987, discloses the bonding of chip electrodes to electrodes on a substrate using a light setting acrylate and epoxy insulation resin. Each of the above resins are prepared according to conventional free radical polymerization processes. Thus, the processes once started and stopped provide materials of certain physical properties and shape which cannot be further modified without the inclusion of additional initiator. Thus, the above-described polymerization processes do not possess a "living" character.

When using transparent wiring boards, ultraviolet (UV) light curable adhesives are highly desirable for flip chip attachment because it is possible to take advantage of the transparency of the wiring board when curing the adhesive. UV light curing of adhesives is a fast and clean process. However, the cure of known UV light curable adhesives is not easy to control. The polymerization of known UV light curable adhesives is a one-step reaction preventing the possibility of reaching intermediate hardening stages. In flip chip attachment, it is desirable to be able to control the modulus of the cured adhesive, and thus the electrical connection between the flip chip and the wiring board. Soft undercured adhesive materials do not possess good dimensional stability whereas hard overcured adhesive materials are characterized by high stress levels in the bonds. It is therefore, an object of this invention to provide a non-tacky thermoplastic radiation curable adhesive for the attachment of microelectronic devices, which can be controllably cured to provide exactly the amount of cure and hardening desired. We have discovered such adhesive compositions which employ iniferter technology.

The term "iniferter" refers to a chemical compound that has a combined function of being a free radical initiator, transfer agent, and terminator, the term "iniferter" being a word formed by the underlined portions of the terms identifying these functions. This term and its use in the production of block copolymers is well known, particularly because of the work of Takayuki Otsu of the Department of Applied Chemistry, Osaka City University, Osaka, Japan. This work is discussed, for example, in an article by Otsu, et al. entitled "Living Radical Polymerizations in Homogeneous Solution by Using Organic Sulfides as Photoiniferters," *Polymer Bulletin*, 7, 45–50 (1982), an article by Otsu, et al. entitled "Living Mono- and Biradical Polymerizations in Homogeneous System Synthesis of AB and ABA Type Block Copolymers" *Polymer Bulletin*, 11, 135–142 (1984), and in European Patent No. 0286376, published Oct. 12, 1988. Despite the rather detailed description of making certain block copolymers according to such disclosures, there is no disclosure of non-tacky thermoplastic radiation curable adhesive compositions which can be controllably cured in order to bond microelectronic devices to transparent wiring boards.

Copending U.S. application Ser. No. 07/356,650, filed May 19, 1989, which is a continuation-in-part of U.S. application Ser. No. 07/212,594, Ali, et al., filed Jun. 28, 1988, (assigned to the assignee of the present case) discloses the use of iniferter technology in the preparation of acrylic block copolymers having the requisite physical properties of adhesion, cohesion, stretchiness, and elasticity, making them suitable for use in pressure-sensitive adhesive compositions. Ser. No. 07/356,650does not teach non-tacky thermoplastic radiation curable adhesive compositions which can be controllably cured in order to bond microelectronic devices to transparent wiring boards.

BRIEF DESCRIPTION OF THE INVENTION

We have found novel radiation curable adhesive compositions which can be controllably cured by utilizing a photoiniferter polymerization technique in order to provide the exact amount of cure and hardening desired. The adhesive compositions are useful for the attachment of microelectronic devices to transparent wiring boards.

The free-radical polymerization occurs in steps so that the extent of reaction, molecular weight, and crosslinking can be controlled simply by turning a light source on and off. Thus, the polymerization mechanism is a "living polymerization", i.e. it can be reinitiated by simply re-exposure of a previously extinguished radiation source. This provides great latitude in controlling the extent of polymerization and thus the extent of cure of the adhesive composition and the desired electrical connection. This enables polymerization of an initially fluid composition to an intermediate stage or stages prior to final cure upon further exposure to radiation. For example, a technician may wish to suspend the curing process in order to check the electrical connection between the microelectronic device and the transparent wiring board. By additional exposure to a radiant energy source, the polymerization process may be continued to provide the desired level of cure and resultant electrical connection.

A first aspect of the present invention relates to an adhesive composition which comprises:

a polymer represented by the formula $I(BT)_n$ wherein

I represents the free radical initiator portion of an iniferter of the formula $I(T)_n$;

T represents the terminator portion of the iniferter;

n is an integer of at least 1; and

B represents a thermoplastic polymer block having a glass transition temperature ranging from about 10° C. to about 130° C., wherein the thermoplastic polymer block comprises polymerized free radically polymerizable monomer, wherein at least one free radically polymerizable monomer has at least two functional groups, at least one of the functional groups being a free radically polymerizable functional group and at least one of the functional groups being a functional group capable of being reacted with a polymerizable functional monomer, and wherein at least one of the free radically polymerizable monomers having at least two functional groups is functionalized after polymerization with a polymerizable functional monomer, wherein said polymerizable functional monomer comprises a monomer having at least two functional groups, at least one functional group being a free radically polymerizable group.

A second aspect of the present invention relates to a method of making the adhesive composition.

A third aspect of the present invention relates to a thermoplastic adhesive composition which comprises:

(a) a polymer having a glass transition temperature ranging from about 10° C. to about 130° C., wherein said polymer comprises polymerized polymerizable monomer wherein at least one polymerizable monomer has at least two functional groups, at least one of the functional groups being a polymerizable functional group and at least one of the functional groups being a functional group capable of being reacted with a polymerizable functional monomer, and wherein at least one of the polymerizable monomers having at least two functional groups is functionalized after polymerization with a polymerizable functional monomer, wherein said polymerizable functional monomer comprises a monomer having at least two functional groups, at least one functional group being a free radically polymerizable group; and (b) an iniferter of the formula $I(T)_n$ wherein I represents the free radical initiator portion of the iniferter;

T represents the terminator portion of the iniferter; and n is an integer of at least 1; and wherein the weight ratio of the polymer to the iniferter ranges from about 99.9:0.1 to about 90:10.

A fourth aspect of the present invention relates to a method making the adhesive composition.

The superior non-tacky thermoplastic adhesive compositions of the present invention can be cured in a stepwise fashion by intermittent controlled exposure to a source of radiation thus providing exactly the amount of cure and hardening desired and avoiding undercuring or overcuring. The adhesive compositions provide upon irradiation a crosslinked polymer With a considerable increase of modulus. Another advantage of the adhesive compositions is their thermal stablity which provides for their usage over a wide temperature range. Moreover, the adhesive compositions possess superior shelf lives.

A fifth aspect of the present invention relates to a method of bonding microelectronic devices to a UV or visible light transparent wiring board using the adhesive compositions of the present invention by the exposure of the adhesive compositions to UV or visible radiation in a controlled and intermittent fashion such that the appropriate level of cure and thus a superior electrical connection is obtained.

The method of connecting a microelectronic device to a transparent wiring board comprises the steps of:

(a) preparing a laminate which comprises:

(i) a transparent wiring board comprising a transparent substrate patterned with conductive electrodes wherein the transparent substrate is transparent to at least some radiation in the range of about 200 to about 800 nm;

(ii) a microelectronic device having conductive bumps positioned such that the conductive bumps of the microelectronic device are aligned in correspondence with the conductive electrodes of the transparent substrate; and (iii) either adhesive composition of the invention disposed between the conductive bumps and conductive electrodes;

(b) applying heat and sufficient pressure to the laminate to press the conductive bumps and wiring pattern through the adhesive composition against one another in conductive contact thereby electrically connecting the conductive bumps to the conductive electrodes and thereby expanding the adhesive composition outwardly wherein the adhesive composition surrounds a peripheral portion of the microelectronic device and simultaneously or subsequently exposing the adhesive composition to radiation of about 200 nm to about 800 nm from a radiant energy source until crosslinking occurs in order to form a partially cured adhesive composition;

(c) terminating the application of pressure, heat, and radiation in any order and evaluating the electrical connection between the conductive bumps of the microelectronic device and the conductive electrodes of the transparent substrate;

(d) repeating steps (b) and (c), if necessary, until the desired electrical connection is obtained.

DETAILED DESCRIPTION OF THE INVENTION

The novel adhesive compositions of the invention are referred to herein as Adhesive Compositions I and II.

Adhesive Composition I

Adhesive Composition I comprises $I(BT)_n$ wherein I, B, T, and n are as defined above. $I(BT)_n$ is made by the following method. An iniferter represented by the general formula $I(T)_n$ capable upon being subjected to an appropriate energy source of forming free radicals $I(\cdot)_n$ and nT. wherein n is an integer of at least 1, is mixed with a monomer charge. The monomer charge comprises monomer which is free radically polymerizable in the presence of $I(\cdot)_n$ to form polymer block B. The free radical $I(\cdot)_n$ is a highly reactive free radical capable of initiating free radical polymerization and T· is a less reactive free radical which is generally much less capable of initiating free radical polymerization than I. but will rejoin with $I(\cdot)_n$ or a free radical polymer segment free radically polymerized with $I(\cdot)_n$ upon termination of the energy source.

The mixture of $I(T)_n$ and the monomer charge is exposed to an energy source capable of forming free radicals $I(\cdot)_n$ and nT·. The exposure is maintained until the monomer charge polymerizes with $I(\cdot)_n$ to form a free radical polymer segment represented by the formula $I(B\cdot)_n$ and nT· to combine to form a polymer represented $I(B\cdot)_n$. The exposure is subsequently terminated to cause by the formula $I(BT)_n$.

The particular energy source and its intensity are selected to result in dissociation of the iniferter to free radicals. When employing a photoiniferter which will dissociate upon exposure to ultraviolet light radiation, an ultraviolet light source is utilized. The intensity and rate of irradiation is chosen so that it will advance the polymerization at a reasonable rate without deleteriously affecting the polymer segment being produced. An ultraviolet light source having a wave length on the order of 300 to 400 nm spaced approximately 10 cm from the reactants to provide an exposure of 2 milliwatts per square centimeter has been found to produce suitable results. Reaction times on the order of 2 to 50 hours in the absence of a metal compound accelerator have been found to be typical, depending upon the intensity of the radiation, with faster reaction times being observed at greater intensities. Reaction times on the order of 0.2 to 5 hours could be expected upon use of the accelerator described in copending application entitled Ali, U.S. application Ser. No. 07/454,374, "A Method of Accelerating Photoiniferter Polymerization, Polymer Produced Thereby, and Product Produced Therewith", (assigned to the assignee of the present case) incorporated by reference herein.

The reactants and any solvent employed are charged into an energy source-transparent vessel and therein subjected to the energy source. If the energy source is ultraviolet light radiation, a suitable ultraviolet light-transparent vessel is utilized. The reaction is preferably conducted in a vessel with agitation to permit uniform exposure of the reactants to the energy source. While most of the reactions have been conducted by employing a batch process, it is possible to utilize the same technology in a continuous polymerization operation.

The reaction mixture may include a suitable inert solvent but it is not necessary since some of the monomeric materials are liquid themselves and may thus be charged into the reaction vessel without utilization of a solvent. The solvent, if utilized in the free radical polymerization, may be any substance which is liquid in a temperature range of about $-10°$ C. to about $50°$ C., is substantially transparent to the energy source employed to permit dissociation of the iniferter to form free radicals, is inert to the reactants and product, and will not otherwise adversely affect the reaction. Suitable solvents include water, toluene, alkyl acetates such as ethyl acetate, alkanes such as hexane or heptane, and alcohols such as methyl alcohol, ethanol, isopropyl alcohol, and mixtures of one or more of these. Other solvent systems are useful. The amount of solvent is generally about 30 to 80 percent by weight based on the total weight of the reactants and solvent. In addition to solution polymerization herein described, the copolymerization may be carried out by other well known techniques such as suspension, emulsion, and bulk polymerization.

The monomer used in forming block B must be selected so that block B is formed from a monomer charge comprising free radically polymerizable monomer which includes at least one monomer having a functionality of at least two which is capable of being functionalized with a polymerizable functional monomer after polymerization into block B. The monomer having a functionality of at least two should contain at least one, preferably one, free radically polymerizable functional group and at least one, preferably one, functional group selected from the group consisting of an azlactone group, an amino group, a hydroxyl group, an epoxide group, a carboxyl group, an isocyano group, and the like, which can react with a polymerizable functional monomer. Preferably, block B is formed from at least one monomer having a functionality of two which is capable of being functionalized with a polymerizable functional monomer after polymerization, in order to avoid excessive crosslinking.

Preferably, the monomer charge useful in forming block B comprises monomer selected from the group consisting of methyl methacrylate (MMA), 2-vinyl-4,4-dimethyl-2-oxazolin-5-one (VDM), dimethylaminoethyl methacrylate (DMAEMA), glycidyl acrylate (GA), acrylic acid (AA), glycidyl methacrylate (GMA), isooctyl acrylate (IOA), trimethoxysilylpropyl methacrylate (Tris), isocyanoethyl methacrylate (IEM), hydroxyethyl methacrylate (HEMA), hydroxyethyl acrylate, methyl acrylate, ethyl acrylate, isobornyl methacrylate, norbornyl acrylate, butyl acrylate, phenethyl methacrylate, and mixtures thereof. Most preferably, the monomer charge used in forming block B comprises a mixture of VDM and DMAEMA, preferably at a weight ratio of about 90:10 to about 10:90 in order to provide good crosslinkability and minimal shrinkage.

Preferably, the monomers used in forming block B are selected and used at ratios to result in a cured adhesive composition yielding as low of a maximum resistance (R max) value as possible in order to obtain the best electrical connection possible.

The photoiniferter polymer $I(BT)_n$ is functionalized with a suitable polymerizable functional monomer. The polymerizable functional monomer contains at least two functional groups, at least one functional group, preferably one, being a free radically polymerizable group. At least one functional group, preferably one, comprises a functional group such as an azlactone group, an amino group, a hydroxyl group, an epoxide group, a carboxyl group, an isocyano group, and the like, which is capable of reacting with a functional group on the free radically polymerizable monomer having at least two functional groups which was polymerized into block B. Suitable polymerizable functional monomers include but are not limited to the following: HEMA, 2-hydroxyethyl acrylate (HEA), AA, methyl acrylic acid (MAA), VDM, IEM, GMA, GA, DMAEMA, pentaerythritol triacrylate, pentaerythritol trimethacrylate, and mixtures thereof.

The preferred monomers which can be used for functionalization are selected from the group consisting of VDM, HEMA, and mixtures thereof due to their high reactivity and ease of functionalization. A preferred monomer for use in the functionalization process comprises HEA. HEA would constitute a most preferred monomer if it were commercially available in a pure form. However, due to impurities typically contained in commercially available HEA, gelling can sometimes occur. GA and GMA although acceptable are less preferred due to their lower reactivity. IEM which is somewhat harder to control due to IEM's very high reactivity is also less preferred. AA and MAA are least preferred due to their corrosive nature.

The functionalization of the polymer I(BT)$_n$ is typically carried out at a temperature of about 30° C. to about 120° C. in a suitable reaction vessel. Sufficient solvent, if needed, can be used to facilitate the functionalization. Typically, about 10 to 80 weight percent, preferably about 25 to 50 weight percent of a solvent is used based upon the weight of the solvent and reactants. Useful solvents include, but are not limited to methyl ethyl ketone (MEK), ethyl acetate (EtOAc), toluene, chloroform, dichloromethane, and the like. An effective amount of a suitable catalyst such as 1,8-diazabicyclo[5.4.0]undec-7-ene (DBU) and the like is typically used at a mole ratio of polymerizable functional monomer to catalyst of about 99:1 to about 99:5, preferably about 87:3 to about 99:5. An effective amount of an inhibitor such as 2,6-di-tert-butyl-4-methyl phenol and the like is preferably used (i.e. about 50 ppm to about 1,000 ppm, most preferably about 100 ppm to about 200 ppm) based upon the amount oil polymerizable functional monomer. The polymer is functionalized from about 10 to about 100 mole % based upon the amount of monomer contained in said polymer having a functionality of at least 2 which is capable of being functionalized with a polymerizable functional monomer. The functionalization of I(BT)$_n$ results in an adhesive composition which will provide a crosslinked polymer upon cure.

Examples of photoiniferters I(T)$_n$ include: xylylene bis(N,N-diethyldithiocarbamate) (XDC), benzyl carbazolyl thiocarbamate (CDC), xylylene carbazolyldithiocarbamate (XCDC), durene $\alpha,\alpha'\alpha'',\alpha'''$-tetrakis(N,N-diethyldithiocarbamate) (DDC), benzyl N,N-diethylthiocarbamate (BDC), mixtures thereof, and the like. Preferably, I(T)$_n$ is selected from the group consisting of XDC, CDC, XCDC, DDC, and mixtures thereof. Most preferably, I(T)$_n$ is selected from the group consisting of XDC, XCDC, and mixtures thereof for reasons of better and more controllable cure. The letter n represents an integer of at least 1, preferably about 2 to about 12, and most preferably about 2 to about 6.

Adhesive Composition II

Adhesive Composition II comprises a polymer combined with I(T)$_n$. The polymer comprises polymerized polymerizable monomer wherein at least one polymerized polymerizable monomer has at least two functional groups, at least one, preferably one, of the functional groups being a polymerizable functional group and at least one, preferably one, of the functional groups being a functional group capable of being reacted with a polymerizable functional monomer, and wherein at least one monomer having at least two functional groups is functionalized after polymerization with a polymerizable functional monomer, wherein the polymerizable functional monomer comprises a monomer having at least two functional groups, at least one functional group being a free radically polymerizable group.

Polymers which can be used in forming Adhesive Composition II include but are not limited to polymers prepared according to conventional polymerization methods such as thermal polymerization, from the monomer used in forming the photoiniferter polymer of Adhesive Composition I. Examples of useful polymers include polyvinylbutyral, polyisocyantoethyl methacrylate, polyglycidyl acrylate, polyglycidyl methacrylate, poly 2-vinyl-l,4-dimethyl-2-oxazolin-5-one, polyhydroxyethyl methacrylate, poly 2-hydroxyethyl acrylate, and the like, and mixtures thereof.

The polymer contained in Adhesive Composition II is functionalized according to the same procedure as the I(BT)$_n$ polymer contained in Adhesive Composition I. Monomers useful in forming the polymer of Adhesive Composition II are the same as those useful in forming block B of I(BT)$_n$ of Adhesive Composition I. In addition, the same preferred monomers, ratios of monomer, glass transition temperatures, etc. applicable to I(BT)$_n$ are applicable to the polymer of Adhesive Composition II.

The weight ratio of polymer to I(T)$_n$ in Adhesive Composition II ranges from about 90:10 to about 99.9:0.1, preferably about 99.9:0.1 to about 92:8, and most preferably about 99.5:0.5 to about 95:5.

Optional Components

About 0.1 to about 5.0 weight percent of a photosensitizer or sensitizer can optionally be included in Adhesive Composition I or II based upon the weight of the total adhesive composition in order to increase the rate of cure. If too much sensitizer is used, interference with the deep curing of the adhesive compositions can occur. Useful sensitizers include Michler's ketone, camphorquinone, mixtures thereof, and the like. Preferably, the sensitizer comprises Michler's ketone for better depth of cure.

A filler which is transparent to at least a portion of the radiation used for curing can comprise up to about 60 weight percent, preferably about 10 to about 60 weight percent, and most preferably about 30 to about 50 weight percent of Adhesive Composition I or II. The filler increases adhesion by decreasing the coefficient of thermal expansion. Useful fillers include silica, glass, quartz, mixtures thereof and the like. Preferably, the filler comprises silica.

About 0.1 to about 20 weight percent of a silane coupling agent can optionally be included in Adhesive Composition I or II based upon the weight of the total adhesive composition in order to provide stability under humidity, preferably about 0.1 to about 5 weight percent, and most preferably about 0.5 to about 2 weight percent. Useful silane coupling agents include but are not limited to the following: functional silicones such as trimethoxysilylpropyl methacrylate (Tris), amino silane, epoxy silane, and mixtures thereof. Preferably, the coupling agent comprises a functional silane. Most preferably, the coupling agent comprises trimethoxysilylpropyl methacrylate (Tris) for reasons of good reactivity.

About 1 to about 20 weight percent of a multifunctional monomer, preferably about 5 to 10 weight percent can be included in Adhesive Composition I or II based upon the total weight of the adhesive composition in order to increase the crosslinkability of the polymer and adjust the final Tg of the polymer composition. The term "multifunctional monomer" as used herein refers to a monomer which contains more than one polymerizable moiety. Preferably, the multifunctional monomer used herein contains 2 to 6, most preferably 3, polymerizable moieties.

Examples of suitable multifunctional monomers include but are not limited to the following: pentaerythritol trimethacrylate, pentaerythritol tetramethacrylate, ethoxylated bisphenol A dimethacrylate, hexane dioldioacrylate, pentaerythritol triacrylate, and mixtures thereof. Preferably, the multifunctional monomer used is selected from the group consisting of pentaerythritol triacrylate, hexane dioldiacrylate, pentaerythritol trimethacrylate, and mixtures thereof.

Adhesive Film Preparation

Films of Adhesive Composition I or II can be prepared by coating either composition onto a suitable substrate such as a polyester film by use of a coating device such as a knife coater at a thickness of about 5 to about 100 μm, preferably about 15 to about 30 μm. Preferably, the substrate is coated with a release coating prior to coating with the adhesive composition in order to facilitate the removal of the adhesive film thus formed. The adhesive film is dried, preferably for about 1 to about 24 hours at a temperature ranging from about 20° C. to about 80° C. prior to removal of the film from the substrate.

The adhesive compositions cain be coated onto a microelectronic device or a transparent wiring board in a number of ways in order to bond the microelectronic device to the transparent wiring board. One way is to apply the side of the microelectronic device having conductive bumps onto the adhesive film described above and use sufficient heat activation (above 40° to 100° C.) and sufficient pressure to tackify or soften the adhesive film but not to melt the film in order to transfer the adhesive to the microelectronic device. When the microelectronic device is subsequently removed from the release backing it is thus coated with a uniform layer of adhesive. It may also be possible to coat the adhesive composition directly onto the transparent wiring board to which the microelectronic device is to be bonded, directly onto the microelectronic device itself, or otherwise dispose the adhesive composition between the microelectronic device and transparent wiring board without first forming a separate film.

The transparent wiring boards to which the microelectronic devices can be bonded comprise ultraviolet and/or visible light transparent substrates such as glass, plastic, and the like having a wiring pattern comprising conductive electrodes. The term "electrodes" as used herein includes the term circuits. The conductive electrodes contact at least one surface of the transparent substrate in order to make electrical connections (i.e., conductive contact) with the microelectronic device. Typically the wiring pattern is formed on the surface of the transparent substrate.

The conductive electrodes cover only a portion of the transparent substrate thus permitting the passage of light radiation therethrough. Suitable conductive electrodes comprise conductive ceramics such as indium tin oxide and conductive metals such as nickel, copper, aluminum, gold, and the like. Such conductive electrodes typically have a thickness of about 100 Å to about 5000 Å and a resistance of about 10 mohm to about 100 mohm. The conductive electrodes on the transparent substrate are designed to receive the corresponding conductive bumps of the microelectronic device.

A microelectronic device such as a semiconductor device is typically electronically connected to a wiring board by the establishment of electrical connections between conductive portions on the microelectronic device referred to herein as conductive bumps and the conductive electrodes of the wiring board. The term "conductive bump" as used herein also includes conductive pads. Such conductive bumps are typically metal bumps or pads which are formed on electrode pads of the microelectronic device by conventional electroplating methods. Each conductive bump is typically formed from Au, Ag, Cu, etc. solder and has a thickness of 3–30 μm.

The microelectronic device which is typically first coated with Adhesive Composition I or II is aligned with the conductive electrodes of the transparent substrate such that the adhesive composition is disposed between the microelectronic device and the transparent substrate in order to form a laminate. The alignment of the microelectronic device having conductive bumps and the conductive electrodes of the transparent substrate necessary to form the electrical connections will be recognized by those skilled in the art. The microelectronic device is typically held by a movable tool and the positions of the conductive bumps of the microelectronic device are adjusted to be in correspondence with the conductive electrodes of the wiring board. Then the conductive bumps are pressed against the wiring pattern by the downward movement of the tool and the laminate is heated. The pressure and heat thus applied causes the adhesive composition which is disposed between the conductive bumps and the conductive electrodes to flow outwardly so that the adhesive composition is removed from the area between the conductive bumps and the conductive electrodes such that the adhesive composition surrounds the peripheral portion of the microelectronic device and such that the conductive bumps are electrically connected to the conductive electrodes.

In this position, radiation from a radiant energy source is applied to the adhesive composition of the present invention in a controlled and intermittent fashion in order to gradually cure the adhesive composition to obtain the exact amount of cure and thus electrical connection desired. The application of heat, pressure, and radiation is discontinued while the cure of the adhesive and electrical connection is evaluated. Upon completion of the curing process the adhesive composition is stiffened or solidified. By such stiffened adhesive composition the microelectronic device and wiring board are fixed with the conductive bumps being electrically connected to the conductive electrodes. Thereafter, heat, radiation and pressure application is terminated.

Bonding of the microelectronic device to the transparent wiring board is typically conducted at a temperature range of about 130° C. to about 200° C., preferably about 180° C. to about 200° C. If the bonding temperature is too low the adhesive film will not be sufficiently melted. If the bonding temperature is too high depolymerization or decomposition of the adhesive can occur.

Bonding of the microelectronic device to the transparent wiring board is typically conducted under a pressure of about 1 to about 30 MPa for reasons of better flow of the adhesive composition and good adhesion, preferably about 5 to about 15 MPa. Exposure to a radiant energy source is typically continued until the desired resistance of the electrical connection in the absence of applied pressure is obtained.

Ultraviolet or visible light radiation is typically directed through the side of the transparent substrate opposite the adhesive and microelectronic device. The intensity or rate of radiation is chosen such that it will advance the polymerization at a reasonable rate without deleteriously affecting the polymer segment being produced. An ultraviolet or visible light source having a wavelength on the order of about 200 to about 800 nm spaced approximately 1 cm from the transparent substrate to provide an exposure of preferably about 2 to 100 milliwatts per square centimeter has been found to produce suitable results.

Reaction times on the order of 5 seconds to 60 seconds in the absence of a metal compound accelerator have been found to be typical, depending upon the intensity of the radiation, with faster reaction times being observed at greater intensities. Reaction times in the presence of an accelerator such as those described in copending U.S. application Ser. No. 07/454,374, now U.S. Pat. No. 5,093,385, Ali, "A Method of Accelerating Photoiniferter Polymerization, Polymer Produced Thereby, and Product Produced Therewith", (assigned to the assignee of the present case) incorporated by reference herein, are anticipated to be about 1 second to about 5 seconds.

EXAMPLES

The following detailed description includes exemplary preparations of the adhesive compositions of the invention. All parts and percentages in the Examples and throughout the Specification are by weight unless otherwise specified. Examples 2-6, 8-10 relate to Adhesive Composition I. Examples 7, 11-12 relate to Adhesive Composition II.

Comparative Example

Synthesis of P(MMA/VDM/DMAEMA) (50/30/20) Using a Conventional Initiator

Into a 950 ml amber bottle were charged 50 parts of MMA, 30 parts of VDM, 20 parts of DMAEMA, 0.2 part of Vazo-64 TM initiator (azo-isobutyronitrile, available from Dupont), 200 parts of MEK, and 0.5 parts of tetraethylthiuram disulfide. The solution was purged with nitrogen for 10 minutes. The bottle was sealed and placed in a Launder-O-Meter TM controlled heating bath (available from Atlas Company) set at 65° C. for 24 hours. Analytical results on the copolymer were as follows: Gel Permeation Chromatography (GPC): $\overline{M}n = 81,638$; Polydispersity ($\rho$) = 2.4; and Differential Scanning Calorimetry (DSC): $T_g = 55°$ C.

Comparative Example 1b

Functionalization of P(MMA/VDM/DMAEMA) with HEMA

Into a 20 ml flask fitted with a magnetic stirrer and a thermometer were charged 41.9 parts of polymer solution from Comparative Example 1a, 4.0 parts of MEK, 0.23 part of DBU, 0.03 part of BHT, and 3.9 parts of HEMA. The solution was heated for 3 hours at 55° C. IR spectrum analysis revealed quantitative reaction of HEMA with VDM (no peak present at 1800 cm$^{-1}$).

Example 2a

Synthesis of Copolymer GA/MMA (41.7/58,3)

Into a 250 ml volume clear flint glass bottle were charged 50 parts of GA, 70 parts of MMA, 0.8 part of XDC, and 200 parts of ethyl acetate. The solution was purged with nitrogen gas for about 10 minutes, following which the bottle was sealed, placed on a roller mill, and irradiated with a bank of six GE 15 watt cylindrical black light lamps. The mixture became progressively more viscous. The completion of the reaction was monitored by percent solids analyses. The quantitative conversion was achieved after 40 hours of irradiation. DSC analysis revealed a $T_g$ of 47° C.

Example 2b

Functionalization of P(GA/MMA) with AA

The copolymer of GA/MMA (31.8 parts) of Example 2a, 0.2 part chromium octanoate, Cr(Oct)$_3$, 2.9 parts AA, 50 parts EtOAc, 0.04 part 2-tert-butyl-4-methylphenol, and 0.04 part 2,6-di-tert-butyl-4-methylphenol (BHT), were charged into a 250 ml volume round bottomed flask. The solution was heated to 70° C. by gradual increase of temperature for 3.4 hours. The solution was cooled and precipitated in 200 parts of methanol. The solid polymer was isolated by filtration and dried in a vacuum oven at $-40°$ C. Proton NMR spectrum analysis revealed complete functionalization of P(GA/MMA) polymer with AA.

Example 3a

Synthesis of Copolymer of GMA/MMA/IOA (41.7/41.7/16.7)

GMA (50 parts), MMA (50 parts), IOA (20 parts), XDC (1.0 part) and EtOAc (200 parts) were charged into a 500 ml volume clear flint glass bottle. The solution was purged with nitrogen gas for about 10 minutes, after which the bottle was sealed, placed on a roller mill, and irradiated with a bank of six GE 15 watt cylindrical black light lamps. The mixture became progressively more viscous. The completion of the reaction was monitored by percent solids analyses. The quantitative conversion was achieved after 40 hours of irradiation. DSC analysis revealed a $T_g$ of 53.8° C.

Example 3b

Functionalization of P(GMA/MMA/IOA) with AA

The copolymer of P(GMA/MMA/IOA) of Example 3a (47.3 parts), Cr(Oct)$_3$ (0.66 part), AA (3.7 parts), EtOAc (47 parts), and BHT (0.04 part) were charged into a 250 ml volume round bottom flask. The solution was refluxed for 5 hours and precipitated in 200 parts of ether. The solid polymer was isolated by filtration and dissolved in EtOAc to yield a 40 percent solid solution.

Example 4a

Synthesis of Copolymer of VDM/DMAEMA (25/75)

Into a 473 ml clear bottle were charged 25 parts of VDM, 75 parts of DMAEMA, 3 parts of XDC, and 100 parts of EtOAc. The solution was purged with nitrogen for 10 minutes. The bottle was sealed, placed on a roller mill, and irradiated with a bank of six GE 15 watt cylindrical black light lamps. The solution was irradiated for 23 hours. A percent solids calculation revealed quantitative conversion. DSC analysis revealed a $T_g$ of 15° C. for the copolymer.

Example 4b

Functionalization of P(VDM/DMAEMA) with HEMA

Into a 100 ml flask fitted with a magnetic stirrer and a thermometer were charged 21.5 parts of the polymer solution from Example 4a, 2.5 parts of HEMA, 0.15 part of DBU, and 0.03 part of BHT. The solution was heated for 4 hours at 55° C. I.R. spectrum revealed quantitative reaction of HEMA with VDM.

Example 5a

Synthesis of Copolymer of VDM/DMAEMA (25/75)

Into a 473 ml clear bottle were charged 25 parts of VDM, 75 parts of DMAEMA, 0.5 part of XDC, and 100 parts of EtOAc. The solution was purged with nitrogen for 10 minutes. The bottle was sealed, placed on a roller mill and irradiated with a bank of six GE 15 watt cylindrical black light lamps. The solution was irradiated for 24 hours. A percent solids calculation revealed quantitative conversion.

Example 5b

Functionalization of P(VDM/DMAEMA) with HEMA

Into a 250 ml flask fitted with a magnetic stirrer and a thermometer were charged 56.3 parts of the polymer solution of Example 5a, 6.6 parts of HEMA, 0.4 part of DBU, 0.06 part of BHT and 10 parts of MEK. The solution was heated at 55° C. for 3 hours. I.R. spectrum analysis revealed quantitative conversion.

Example 6

Functionalization of P(VDM/DMAEMA) with HEMA

Into a 250 ml flask fitted with a magnetic stirrer and a thermometer were charged 53.0 parts of polymer solution from Example 5a, 6.2 parts of HEMA, 0.4 part of DBU, 0.06 part of BHT, and 10 parts of MEK. The solution was heated at 55° C. for 3 hours. I.R. spectrum analysis revealed quantitative conversion.

Example 7

Synthesis of VDM functional polyvinylbutyral

Into a 100 ml flask fitted with a magnetic stirrer and a thermometer were charged 10.25 parts of polyvinylbutyral (available under the trade designation S-Lec BX-L available from Sekisui Company, 29% hydroxyl by weight), 47 parts of EtOAc, 9.4 parts of VDM, 0.5 part of DBU, and 0.06 part of BHT. The solution was heated at 55° C. for 6 hours. The progress of the reaction was monitored by I.R. spectroscopy.

Example 8a

Synthesis of Copolymer of VDM/DMAEMA 35/75

Into a 473 ml clear bottle were charged 25 parts of VDM, 75 parts of DMAEMA, 1.0 part of XDC, and 100 parts of EtOAc. The solution was purged with nitrogen for 10 minutes. The bottle was sealed, placed on a roller mill, and irradiated with a bank of six GE 15 watt cylindrical black light lamps. The solution was irradiated for 24 hours. A percent solids analysis revealed quantitative conversion.

Example 8b

Functionalization of P(VDM/DMAEMA) with HEMA

Into a 100 ml flask fitted with a magnetic stirrer and a thermometer were charged 56.1 parts of the polymer solution of Example 8a, 1.3 parts of HEMA, 0.08 part of DBU, 0.04 part of BHT, and 5 parts of EtOAc. The solution was heated at 55° C. for 4 hours. The progress of the reaction was monitored by I.R. spectrum analysis.

Example 9

Functionalization of P(VDM/DMAEMA) with HEMA

Into a 100 ml flask fitted with a magnetic stirrer and a thermometer were charged 48.2 parts of P(VDM/DMAEMA) polymer solution of Example 5a, 1.13 parts of HEMA, 0.07 part of DBU, 0.06 part of BHT, and 5 parts of MEK. The solution was heated to 55° C. for 3 hours. The progress of the reaction was monitored by I.R. spectroscopy.

Example 10a

Synthesis of Copolymer of VDM/DMAEMA/Tris (20/75/5)

Into a 946 ml clear bottle were charged VDM (20 parts), DMAEMA (75 parts), Tris (5 parts), XDC (4.0 parts) and 100 parts of EtOAc. The solution was purged for 10 minutes, the bottle was sealed, placed on a roller mill, and irradiated with a bank of six GE 15 watt cylindrical black light lamps. The mixture became progressively more viscous. After 24 hours of irradiation the bottle was removed. Quantitative conversion was achieved as shown by a percent solids analysis.

Example 10b

Functionalization of P(VDM/DMAEMA/Tris) with HEMA

The copolymer of VDM/DMAEMA/Tris of Example 10a (50 parts), HEMA (0.94 part, 20 mole % of VDM), EtOAc (6.0 parts), BHT (0.06 part) and DBU (0.06 part) were placed in a round bottomed flask. The solution was stirred at room temperature for 1 hour and then at 50° C. for 2 hours. The reaction was complete as shown by I.R. spectrum analysis.

Example 10c

Functionalization of P(VDM/DMAEMA/Tris) with HEMA

The procedure of Example 10b was followed in order to form a 100% ring opened HEMA functionalized P(VDM/DMAEMA/Tris) polymer. The components were utilized in the following amounts: VDM/DMAEMA/Tris copolymer of Example 10a (50 parts), HEMA (4.7 parts), EtOAc (10 parts), BHT (0.06 parts), and DBU (0.27 parts).

Example 11

Synthesis of PVB Functionalized with IEM

Polyvinylbutyral S-LEC BX-L available from Sekisui Company (10 parts), IEM (6.14 parts), 2,6-di-t-butyl-4-methylphenol (0.031 part) and dibutyltindilaurate (0.21 part) were dissolved in 62 parts of THF. The resulting solution was heated to 40° C. Dry air was injected into the solution during the reaction. After stirring for 150 minutes, no residual isocyanate could be detected by I.R. spectroscopy at 2260 cm$^{-1}$.

Example 12

An adhesive film was prepared as follows. Michler's ketone (0.08 part) and XDC (0.95 part) were dissolved in the PVB-VDM solution of Example 7 (61.70 parts). Silica Novacite 207A (Malvern Company) (31.77 parts) was subsequently added to and mixed with the solution.

The adhesive composition thus formed was cast onto a polyester film using a knife coater. The thickness of the adhesive film was set around 25 μm by adjusting the distance between the knife and the backing. The polyester film used had a silicone release coating to facilitate the release of the adhesive film. The adhesive film was dried at room temperature for 24 hours.

Examples 13–28

Preparation of Adhesive Films

For Examples 13–28, adhesive films were prepared according to Example 12 using the formulations set forth in Table A.

TABLE A

| Example | Solution of Polymer From Ex. | Solution of Polymer Weight % | Michler's Ketone Weight % | Silica Weight % | Other Additive Additive | Other Additive Weight % |
|---|---|---|---|---|---|---|
| 13 | 1b | 100 | | | | |
| 14 | 2b | 100 | | | | |
| 15 | 3b | 100 | | | | |
| 16 | 4b | 99.86 | 0.14 | | | |
| 17 | 5b | 100 | | | | |
| 18 | 5b | 99.78 | | | anthra-quinone | 0.22 |
| 19 | 5b | 99.77 | 0.23 | | | |
| 20 | 5b | 99.40 | | | Sn(Oct)$_2$ | 0.60 |
| 21 | 6 | 58.70 | 0.11 | 41.10 | | |
| 22 | 7 | 98.50 | 0.12 | | XDC | 1.38 |
| 23 | 8b | 99.82 | 0.18 | | | |
| 24 | 8b | 98.62 | 0.11 | 41.27 | | |
| 25 | 9 | 58.62 | 0.11 | 41.27 | | |
| 26 | 9 | 58.22 | 0.10 | 40.99 | Tris | 0.69 |
| 27 | 10b | 100 | | | | |
| 28 | 11 | 99.80 | | | XDC | 0.02 |

Example 29

The adhesion of various adhesives of the present invention were evaluated by measuring the die shear strengths of the adhesives. The test determined the applied force needed to shear a glass chip (2×2×1 mm) bonded to a glass slide (25×25×1 mm) by the adhesive composition of the present invention. The bond strength was measured by using a shear tester. The adhesives were transferred to the glass chips by applying the chips onto the film and using heat activation (about 100° C.) and light pressure by hand in order to soften the adhesive film. When the chips were removed from the release backing, they were covered with a uniform layer of adhesive. The bonding was accomplished by using a die bonder set at 180° C. for several seconds with the simultaneous application of UV irradiation from a UV lamp having an output of 75 mW/cm$^2$ in the 340–380 nm range available from Electro Lite Corporation.

TABLE B

| Adhesive From Example | Bonding Conditions | Shear Strength MPa |
|---|---|---|
| 12 | 30s at 180° C. with UV | 8.6 |
| 14 | 20s at 180° C. with 15s UV | 11.1 |
| 22 | 30s at 180° C. with 10s UV | 9.5 |
| 23 | 15s at 180° C. with UV | 9.6 |
| 26 | 15s at 180° C. with UV | 9.1 |
| 27 | 15s at 180° C. with UV | 9.4 |

The selection and use of adhesives for the attachment of microelectronic devices requires a minimum bond strength of 6 MPa [Military Standard (MIL STD) 883L, method 5011]. The data contained in Table B thus demonstrates that a high level of adhesion is obtained upon use of the adhesive compositions of the present invention.

Example 30A

The curing abilities of the adhesive compositions of the present invention were evaluated by testing the solubility of the films prepared therefrom after UV irradiation with the UV lamp of Ex. 29. Before treatment all the films were soluble in the solvent in which solubility was evaluated after treatment.

TABLE C

| Adhesive From Example | Treatment | Solubility |
|---|---|---|
| 13 | 30s of UV at 180° C. | insoluble in THF |
| 13 | 30s at 180° C. | soluble in THF |
| 14 | 30s of UV at 180° C. | insoluble in EtOAc |
| 15 | 30s of UV at 180° C. | insoluble in EtOAc |
| 16 | 120s of UV at 20° C. | insoluble in THF |
| 16 | 30s of UV at 90° C. | insoluble in THF |
| 17 | 30s of UV at 90° C. | insoluble in THF |
| 18 | 120s of UV at 20° C. | insoluble in THF |
| 18 | 30s of UV at 90° C. | insoluble in THF |
| 19 | 30s of UV at 90° C. | insoluble in THF |
| 20 | 30s of UV at 90° C. | insoluble in THF |
| 22 | 30s at 180° C. | soluble in THF |
| 22 | 120s of UV at 20° C. | insoluble in THF |
| 22 | 30s of UV at 90° C. | insoluble in THF |
| 28 | 30s at 180° C. | soluble in THF |
| 28 | 30s of UV at 180° C. | insoluble in THF |

The data contained in Table C thus demonstrates that in order to obtain good cure (i.e., insolubility in solvent), the irradiation of the adhesive compositions of the present invention is necessary.

Example 30B

The amount of crosslinking of irradiated adhesive films of the invention was measured by extraction of soluble material in refluxing tetrahydrofuran with a soxhlet extractor over a 24 hour period. A Model 218 UV light unit (available from Colight Inc.) containing two 400 watt mercury vapor lamps was used for irradiation. Adhesive film A was prepared by mixing 99.81 weight percent of the polymer solution of Example 5B with 0.19 weight percent Michler's Ketone and coating as described in Example 12. Adhesive film B was prepared similar to film A except that 99.88 weight percent of the polymer solution of Example 3B and 0.16 weight percent of Michler's Ketone was used.

| Adhesive Film | Irradiation Time | % Crosslinking |
| --- | --- | --- |
| A | 1 min at 20° C. | 57 |
|   | 3 min at 20° C. | 87 |
|   | 5 min at 20° C. | 90 |
|   | 10 min at 20° C. | 91 |
| B | 1 min at 20° C. | 65 |
|   | 10 min at 20° C. | 90 |

Example 30B demonstrates the controllable crosslinkability of the adhesive films of the invention.

Example 31

A Rheometrics dynamic mechanical analyzer was used to determine the $T_g$ and measure the elastic modulus of the adhesive film of Example 21. To illustrate the cure in stages, five samples of the adhesive film of Example 21 were irradiated for different lengths of time using the lamp of Ex. 29. A UV lamp available from Electro Lite Corporation having an output of 25 mW/cm$^2$ in the 340–380 nm range was used for curing. Each sample was maintained at a temperature of 130° C. for a time ranging from 0 to 60s.

The data contained in Table D demonstrates that the $T_g$ and the modulus of the adhesive increased regularly with the amount of UV irradiation applied.

TABLE D

| Sample | Irradiation seconds (s) | $T_g$ °C. | Modulus (E') MP$_a$ 30° C. | Modulus (E') MP$_a$ 60° C. | Modulus (E') MP$_a$ 125° C. |
| --- | --- | --- | --- | --- | --- |
| I | no irradiation | 20 | 940 | 5 | <5 |
| II | 3s irradiation | 34 | 2050 | 280 | 15 |
| III | 6s irradiation | 50 | 4300 | 2200 | 150 |
| IV | 12s irradiation | 50 | 4300 | 2200 | 150 |
| V | 60s irradiation | 68 | 4300 | 3800 | 330 |

Example 32

Adhesive films prepared according to the method of the invention were used to bond silicon chips (0.5 mm × 7 mm × 7 mm) to indium tin oxide circuits on glass substrates. The chips bore 120 gold bumped pads (pad pitch: 0.2 mm) in order to make the electrical connections. The circuits were indium tin oxide configured to permit a four probe resistance measurement. Each indium tin oxide circuit had a thickness of 0.1 μm and a sheet resistance of 20 ohms per square. The adhesive film was applied to the active face of the chip by heating the film to about 100° C. on a hot plate surface. Light pressure was applied to laminate the film onto the chip. The laminated structure was removed from the hot plate after several seconds had elapsed.

The final silicon chip attachment was done after alignment of the chip with the conductive electrodes on the substrate. The bonding was done at 180° C. under pressure (around 10 Kg). UV irradiation was applied simultaneously, directly through the glass substrate using the lamp of Example 29. Interconnection resistances were measured using the four probe method. Average minimum and maximum resistances were determined as well as two values characterizing the distribution of the resistance: the midpoint (50% of the values are lower and 50% are higher) and the 90% point (90% of the values are lower, 10% are higher). In Table E below the resistance values (R) are expressed in ohms.

The data contained in Table E demonstrates that good electrical connections are obtained when using the adhesive compositions of the present invention.

TABLE E

| Adhesive From Example | Bonding Conditions | R Average | R Min | R Max | R 50% | R 90% |
| --- | --- | --- | --- | --- | --- | --- |
| 12 | 20s at 180° C. (UV) | 0.64 | 0.15 | 3.12 | 0.51 | 1.15 |
| 22 | 20s at 180° C. (5 s UV) | 0.74 | 0.06 | 4.95 | 0.46 | 1.73 |
| 24 | 25s at 180° C. (20s UV) | 0.79 | 0.04 | 6.97 | 0.33 | 1.67 |
| 25 | 25s at 180° C. (20s UV) | 0.87 | 0.23 | 4.42 | 0.65 | 1.70 |
| 26 | 25s at 180° C. (20s UV) | 0.69 | 0.03 | 5.20 | 0.51 | 1.32 |

While this invention has been described in connection with specific embodiments, it should be understood that it is capable of further modification. The claims herein are intended to cover those variations which one skilled in the art would recognize as the chemical equivalent of what has been described here.

We claim:

1. An adhesive comprising the condensation reaction product of
   (a) a polymer prepared by the ultraviolet light induced polymerization of
      (i) monofunctional acrylate monomers chosen from the group consisting of methyl (meth)acrylate, isooctyl acrylate, ethyl acrylate, isobornyl acrylate, norbornyl acrylate, butyl acrylate, phenethyl methacrylate, dimethylaminoethyl methacrylate and trimethoxysilylpropyl methacrylate and mixtures thereof, and
      (ii) difunctional ethylenically-unsaturated monomers chosen from the group consisting of 2-vinyl-4,4-dimethyl-2-oxazoline-5-one, hydroxyethyl (meth)acrylate, glycidyl (meth)acrylate, isocyanatoethyl methacrylate, (meth)acrylic acid, pentaerythritol tri(meth)acrylate and dimethylamino methacrylate and mixtures thereof; and
      (iii) a photoiniferter chosen from the group consisting of xylylene bis (N,N-diethyldithiocarbamate), benzyl carbazolyl thiocarbamate, xylylene carbazolyldithiocarbamate, durene $\alpha,\alpha',\alpha'',\alpha'''$-tetrakis (N,N-diethyldithiocarbamate), benzyl N,N-diethyldithiocarbamate, and mixtures thereof; with
   (b) a condensation-reactive ethylenically-unsaturated monomer chosen from the group consisting of 2-vinyl-4,4-dimethyl-2-oxazolin-5-one, hydroxyethyl methacrylate, hydroxyethyl acrylate, glycidyl acrylate, glycidyl methacrylate, isocyanatoethyl methacrylate, acrylic acid, methacrylic acid, dimethylaminoethyl methacrylate, pentaerythritol triacrylate, pentaerythritol trimethacrylate, and mixtures thereof;
   wherein no additional photoinitiator other than said photoiniferter is present, and
   wherein said condensation reaction product is controllably crosslinked in a stepwise fashion by intermittent controlled exposure to an ultraviolet radiation source.

2. The adhesive of claim 1 wherein said difunctional ethylenically-unsaturated monomer is 2-vinyl-4,4-dimethyl-2-oxazolin-5-one, said monofunctional acrylate monomer is dimethylaminoethyl methacrylate and said condensation reactive ethylenically-unsaturated monomer is selected from the group consisting of hydroxyethyl methacrylate, hydroxyethyl acrylate, and mixtures thereof.

3. The adhesive of claim 2 wherein the weight ratio of 2-vinyl-4,4-dimethyl-2-oxazolin-5-one to dimethylaminoethyl methacrylate ranges from about 90:10 to about 10:90.

4. The adhesive of claim 1 wherein said iniferter comprises xylylene bis (N,N-diethyl dithiocarbamate).

5. The adhesive of claim 1 which further comprises about 0.1 to about 5.0 weight percent of a sensitizer.

6. The adhesive of claim 1 which further comprises up to about 60 weight percent of a filler.

7. The adhesive of claim 1 which further comprises about 0.1 to about 20 percent of a coupling agent.

8. The adhesive of claim 7 wherein said coupling agent comprises trimethoxysilylpropyl methacrylate.

9. The adhesive of claim 1 which further comprises about 1 to about 10 weight percent of multifunctional monomer.

10. The adhesive of claim 1 which further comprises about 1 to about 10 weight percent of a multifunctional monomer wherein said multifunctional monomer is selected from the group consisting of pentaerythritol trimethacrylate, pentaerythritol triacrylate, ethoxylated bisphenol A dimethacrylate, and mixtures thereof.

11. A film of the adhesive composition of claim 1 coated on a release backing.

* * * * *

UNITED STATES PATENT AND TRADEMARK OFFICE
CERTIFICATE OF CORRECTION

PATENT NO.: 5,356,947

DATED: October 18, 1994

INVENTOR(S): Mahfuza B. Ali and Jean M. Pujol

It is certified that error appears in the above-identified patent and that said Letters Patent is hereby corrected as shown below:

Col. 4, line 66, "nT." should be --nT·--.

Col. 5, line 5, "I." should be --I·--.

Col. 5, line 11, "nT." should be --nT·--.

Col. 5, line 14, after "I(B·)n" please insert --. The exposure is subsequently terminated to cause I(B·)n--.

Col. 5, line 14, "nT." should be --nT·--.

Col. 5, lines 15-16, after "resented" delete the language beginning with "I(B·)n." and ending with "cause".

Col. 7, line 20, "[5.4.0]" should be --[5·4·0]--.

Col. 11, line 33, after "Comparative Example" insert --1a--.

Col. 11, line 64, "(41.7/58,3)" should be --(41.7/58.3)--.

Col. 13, line 50, "35/75" should be --25/75--.

Col. 17, line 41, "<5" should be --<1--.

Signed and Sealed this

Fifth Day of March, 1996

Attest:

BRUCE LEHMAN

*Attesting Officer*     *Commissioner of Patents and Trademarks*